United States Patent
Huber et al.

(10) Patent No.: US 12,320,876 B2
(45) Date of Patent: Jun. 3, 2025

(54) SENSOR ELEMENT AND DEVICE FOR AUTHENTICATING A DATA CARRIER HAVING A SPIN RESONANCE FEATURE

(71) Applicant: GIESECKE+DEVRIENT CURRENCY TECHNOLOGY GMBH, Munich (DE)

(72) Inventors: Stephan Huber, Munich (DE); Christian Schuller, Erharting (DE)

(73) Assignee: GIESECKE+DEVRIENT CURRENCY TECHNOLOGY GMBH, Munich (DE)

( * ) Notice: Subject to any disclaimer, the term of this patent is extended or adjusted under 35 U.S.C. 154(b) by 181 days.

(21) Appl. No.: 18/267,007

(22) PCT Filed: Dec. 13, 2021

(86) PCT No.: PCT/EP2021/025494
§ 371 (c)(1),
(2) Date: Jun. 13, 2023

(87) PCT Pub. No.: WO2022/128153
PCT Pub. Date: Jun. 23, 2022

(65) Prior Publication Data
US 2024/0045010 A1    Feb. 8, 2024

(30) Foreign Application Priority Data
Dec. 16, 2020  (DE) .................... 10 2020 007 707.2

(51) Int. Cl.
*G01R 33/38* (2006.01)
*G01N 24/10* (2006.01)
*G01R 33/383* (2006.01)
*G07D 7/04* (2016.01)

(52) U.S. Cl.
CPC .......... *G01R 33/383* (2013.01); *G01N 24/10* (2013.01); *G07D 7/04* (2013.01)

(58) Field of Classification Search
CPC .... G01R 33/383; G01R 33/60; G01R 33/389; G01R 33/3806; G01N 24/10; G01N 24/08; G07D 7/04; H01F 2003/103; H01F 3/10
See application file for complete search history.

(56) References Cited

U.S. PATENT DOCUMENTS

| | | | |
|---|---|---|---|
| 4,827,235 A | 5/1989 | Inomata et al. | |
| 5,149,946 A * | 9/1992 | Jerome | G06K 7/086 |
| | | | 324/318 |

(Continued)

FOREIGN PATENT DOCUMENTS

| | | |
|---|---|---|
| CN | 1401295 A | 3/2003 |
| DE | 3408086 A1 | 9/1985 |

(Continued)

OTHER PUBLICATIONS

International Search Report from corresponding PCT Application No. PCT/EP2021/025494, Mar. 29, 2022.

(Continued)

*Primary Examiner* — G. M. A Hyder
(74) *Attorney, Agent, or Firm* — Workman Nydegger

(57) ABSTRACT

A sensor element for checking the authenticity of a flat data carrier, in particular a banknote, with a spin resonance feature, includes a magnetic core with an air gap into which the flat data carrier is insertable for authenticity checking, an element for generating a static magnetic flux in the air gap, a modulation coil for generating a time-varying magnetic field in the air gap, and a resonator for exciting the spin resonance feature of the data carrier to be checked and for capturing the signal response of the spin resonance feature. The magnetic core of the sensor element is at least partially formed of an eddy current damping magnetic material.

13 Claims, 3 Drawing Sheets

(56) References Cited

U.S. PATENT DOCUMENTS

| | | | |
|---|---|---|---|
| 5,680,086 | A | 10/1997 | Allis et al. |
| 9,542,788 | B2 | 1/2017 | Kecht |
| 2005/0253585 | A1 | 11/2005 | Xiao et al. |
| 2016/0232735 | A1 | 8/2016 | Kecht |

FOREIGN PATENT DOCUMENTS

| | | | |
|---|---|---|---|
| DE | 69419096 | T2 | 10/1999 |
| DE | 102013016134 | A1 | 4/2015 |
| EP | 0541872 | A1 | 5/1993 |
| EP | 0591542 | A1 | 4/1994 |
| JP | H0739537 | A | 2/1995 |
| SU | 1054752 | A1 | 11/1983 |

OTHER PUBLICATIONS

German Search Report from corresponding DE Application No. 10 2020 007 707.2, Jun. 17, 2021.

Anonymous, "Designing with Magnetic Cores at High Temperatures" Aug. 23, 2016 (Aug. 23, 2016). Internet. Retrieved from the Internet: https://web.archive.org/web/20160823192558/http://www.mag-inc.com/design/design-guides/designing-with-magnetic-cores-at-high-temperatures [retrieved on Mar. 16, 2022].

Anonymous, "Electron Spin Resonance (ESR)" Feb. 22, 2020 (Feb. 22, 2020). Retrieved from the Internet: https://web.archive.org/web/20200222194518/www.its.caltech.edu/-derose/labs/exp6.html [retrieved on Mar. 16, 2022].

Rizwan Ahmad et al. "Theory, Instrumentation, and Applications of Electron Paramagnetic Resonance Oximetry" Chemical Reviews, US, vol. 110, No. 5, May 12, 2010 (May 12, 2010), pp. 3212-3236.

* cited by examiner

SENSOR ELEMENT AND DEVICE FOR AUTHENTICATING A DATA CARRIER HAVING A SPIN RESONANCE FEATURE

BACKGROUND

The invention relates to a sensor element for checking the authenticity of a flat data carrier, in particular a banknote, with a spin resonance feature, and to a checking device with such a sensor element.

Data carriers, such as value or identification documents, but also other valuable items, such as branded articles, are often provided with security elements for protection purposes, which allow a checking of the authenticity of the data carriers, and which also serve as protection against unauthorized reproduction.

To enable automatic authenticity checking and, where applicable, further sensory capturing and processing of the data carriers provided with them, the security elements are often adapted to be machine-readable. Security elements with magnetic areas have long been used for this purpose, for example, and their information content can be captured and evaluated automatically by the magnetic sensor of a banknote processing system during authenticity checking.

In the automatic authenticity checking, it is also known to use security elements with spin resonance features to protect documents and other data carriers.

Spin resonance features are generally based on resonant energy absorption of a spin ensemble in an external magnetic field. Physically, resonant energy absorption is based on the splitting of the energy states of the spin ensemble in the external magnetic field. Spins whose magnetic moments are oriented parallel to the external field have a lower energy state than spins with an antiparallel magnetic moment. By irradiating an alternating magnetic field of suitable strength oriented perpendicular to the external magnetic field that is known as the polarization field, resonant transitions between energy levels can be excited.

The resonant frequency $\omega_L$ necessary to excite the transitions is given by the energy difference of the split levels, where $\gamma$ is the gyromagnetic ratio of the spins involved, and $B_c$ is the relevant characteristic magnetic field. The characteristic resonance frequency of a spin ensemble can also be called the Larmor frequency.

For authenticity protection, both nuclear spins and electron spins can be used as spin ensembles in security elements; accordingly, resonant excitation is referred to as nuclear spin resonance (Nuclear Magnetic Resonance, NMR) or electron spin resonance (ESR). Materials with high electron spin density, in which the interaction between the spins can no longer be neglected, can also be used. These include ferro- and ferrimagnetic materials, and these cases are generally referred to as ferromagnetic resonance (FMR).

For NMR and ESR, the relevant characteristic magnetic field $B_c$ is substantially given by the external magnetic field $B_0$; for FMR, the resonance condition also depends on internal fields present in the material, which together with the external magnetic field form an effective field $B_{\it{eff}}$, which then represents the characteristic magnetic field $B_c$ relevant for the calculation of the resonance frequency.

At common magnetic field strengths, the resonant frequency for NMR is typically in the MHz range, while for ESR and FMR it is typically much higher in the GHz range.

SUMMARY

In view of this, the invention is based on the problem of specifying a device which allows a reliable authenticity checking of data carriers with spin resonance features, and which in particular also allows the checking of rapidly moving data carriers.

The invention provides a sensor element for checking, in particular authenticity checking, a flat data carrier with a spin resonance feature. The data carrier may be, for example, a banknote. The sensor element includes a magnetic core with an air gap into which the flat data carrier is insertable for authenticity checking, an element for generating a static magnetic flux in the air gap, a modulation coil for generating a time-varying magnetic field in the air gap, and a resonator for exciting the spin resonance feature of the data carrier to be checked and for capturing the signal response of the spin resonance feature. The magnetic core of the sensor element is at least partially formed of an eddy current damping magnetic material.

The eddy current damping magnetic material advantageously comprises, at least along one spatial direction, an electrical conductivity that is at least 3 times, preferably at least 5 times, in particular at least 10 times lower than that of soft iron solid material.

In an advantageous embodiment, the magnetic core comprises, as eddy current damping magnetic material, a lamellae package of a soft magnetic material, in particular based on an SiFe alloy, an NiFe alloy, a CoFe alloy, an AlFe alloy or a metallic glass. Due to the small cross-section of the lamellae and the insulation layers between them, the electrical conductivity of the starting material is strongly reduced, while the advantageous magnetic properties of the soft magnetic starting material are retained.

The electrical conductivity of the lamellae package is strongly dependent on the thickness of the lamellae, with typical lamellae thicknesses being about 35 μm or even less. The conductivity of a lamellae package is also strongly direction-dependent and particularly low perpendicular to the lamellae plane. Therefore, the lamellae are advantageously arranged in such a way that the direction of the eddy current inducing magnetic field, in particular the modulation field, lies in the plane of the lamellae.

Also advantageously, the magnetic core may comprise a ferrite as the eddy current damping magnetic material. The mentioned ferrites are ferrimagnetic materials, for example materials based on MnZn or on NiZn, which are formed into the desired magnetic core or magnetic core part by sintering. Ferrites are characterized by a high permeability with still acceptable saturation magnetization and at the same time have a very low electrical conductivity.

Furthermore, the magnetic core can advantageously comprise, as eddy current damping magnetic material, a soft magnetic powder, the powder particles of which are electrically insulated from one another. The starting material for such powder cores can be, for example, pure iron or carbonyl iron. Other possibilities include SiFe, NiFe, NiMoFe or SiAlFe alloys.

The electrical insulation of the powder particles can be achieved, for example, by dispersing the powder in an insulating binder. Furthermore, electrical insulation can be provided by an oxide layer on the powder surface or another suitable coating. The powder is then formed into the desired magnetic core or magnetic core part.

The advantageous magnetic properties of the magnetic core are then derived from the soft magnetic powder, while the electrical conductivity is greatly reduced by the electrical insulation of the individual powder grains compared to the soft magnetic solid material. Soft magnetic powder material is characterized by its higher saturation magnetization compared to ferrite, which makes it suitable for the use at high magnetic field strengths.

Further, the magnetic core may comprise, as eddy current damping magnetic material, a package of parallel arranged soft magnetic rods which are electrically insulated from each other. The material of the rods can be, for example, pure iron, carbonyl iron or a SiFe, NiFe, NiMoFe or SiAlFe alloy. Electrical insulation can be provided, for example, by coating the rods with an insulating material or by an oxide layer on the surface of the rods. Furthermore, it is possible to glue the rods with an electrically insulating adhesive. The diameter of the rods is advantageously less than 2 mm, preferably less than 0.5 mm.

Similar to a lamellae package, a rod package comprises strongly anisotropic electrical conductivity, although the properties of the solid material are largely retained only in one direction, namely along the rod axis. In the two perpendicular directions, the electrical conductivity is strongly reduced. Therefore, the rods are advantageously arranged in such a way that the direction of the eddy current inducing magnetic field, in particular the modulation field, is parallel to the rod axis.

The following table shows typical values for the maximum permeability $\mu_{max}$ (permeability of the material shortly before reaching the saturation), the saturation magnetization $B_S$ and the electrical conductivity $\sigma$ of various materials addressed in the present application. The entry soft iron refers to a soft iron solid material with advantageous magnetic properties but high electrical conductivity (reference material).

|  | $B_S$ (T) | $\mu_{max}$ | $\sigma$ (S/m) |
|---|---|---|---|
| Soft iron (reference material) | 2.1 | 15.000 | $10^7$ |
| Electrical sheet (lamellae package) | 1.7 | 10.000 | $2*10^6$ |
| Ferrite | 0.3 | 200 | $1*10^{-6}$ |
| Powder material | 1.2 | 20 | $1*10^{-5}$ |

The choice of material is made for a specific design of a magnetic core, taking into account the desired size of the core, the losses due to a magnetic leakage flux and the eddy currents that occur. As can be seen from the table, eddy currents are suppressed particularly efficiently by ferrite and powder materials because of their extremely low electrical conductivity. These materials can therefore be used in a magnetic core, especially in the vicinity of the air gap, where eddy currents are particularly disturbing.

At the same time, however, ferrite and powder materials have a lower saturation flux density and a lower permeability than laminated materials. If, therefore, an almost static, high magnetic flux is to be conducted in an application with as little loss as possible, for example in the connecting piece between permanent magnet and air gap, the use of laminated materials is ideal in these areas, since their high saturation flux density enables a compact design, and their high permeability efficiently suppresses magnetic leakage flux.

In an advantageous embodiment, in addition to the at least one eddy current damping magnetic material, the magnetic core also comprises a solid material of high permeability and high saturation flux density, in particular soft iron. In this manner, the advantageous properties of both materials are combined, and a particularly low magnetic resistance of the entire magnetic circuit is achieved.

Advantageously, the magnetic core is formed by an eddy current damping magnetic material at least in one, preferably in both, areas adjacent to the air gap. This is advantageous because particularly high eddy currents occur in these areas.

Advantageously, several different eddy current damping magnet materials can also be used in one magnetic core. For example, the areas adjacent to the air gap can be formed by an above-mentioned ferrite magnetic material or powder magnetic material, which has a particularly low electrical conductivity, while further areas of the magnetic core are formed by a mentioned lamellae package, which despite its eddy current damping properties still has a high permeability and a high saturation flux density. The further areas can also form the entire remainder of the magnetic core, so that the entire magnetic core is formed from eddy current damping magnetic materials.

In a preferred embodiment, the modulation coil is arranged in the air gap of the magnetic core. In this manner, only comparatively low eddy currents are induced in the magnetic core. In another, likewise preferred embodiment, the modulation coil is wound around a region with eddy current damping magnetic material, in particular around a region with said ferrite magnetic material or powder magnetic material. This allows a smaller gap width and thus a higher static magnetic field in the gap.

The element for generating a static magnetic flux is advantageously formed by at least one permanent magnet. This reduces energy consumption and waste heat compared to a design in which also the static portion of the magnetic flux is generated by an electromagnet. However, in other designs it may also be advantageous to generate not only the time-varying portion but also the static portion of the magnetic flux in the air gap by means of electromagnets. This enables particularly easy handling after the sensor element has been switched off, especially when setting up, disassembling and transporting the checking device.

In particular, it is provided that the element for generating the static magnetic flux is formed by several permanent magnets. This allows a higher flux density to be achieved in the air gap.

It is also advantageous for a permanent magnet to combine it with a magnetic core of non-permanently magnetized material. This allows greater design freedom in the construction form, easier manufacturability and greater mechanical robustness of the construction.

The resonator is advantageously arranged in the air gap of the magnetic core. Advantageously, a surface resonator is used. This allows a small size and a geometry of the magnetic field that is well adapted to the flat sample.

Advantageously, the sensor element further comprises a ramp coil for generating a magnetic field in the air gap that varies slowly in time with respect to the modulation field. The ramp coil is preferably wound around the magnetic core, in particular an eddy current damping region of the magnetic core. The ramp coil serves in particular to generate a ramp function of the polarization field and/or to compensate for any drifts in the strength of the polarization field.

Said modulation coil is preferably adapted to generate a magnetic field in the air gap varying with a frequency between about 1 kHz and about 1 MHz. Said ramp coil is preferably adapted to generate a magnetic field in the air gap varying with a frequency below about 1 kHz. Said resonator is preferably adapted for excitation and capture of spin resonance signals with a frequency between about 1 MHz and 100 GHz.

The spin resonance feature of the data carrier to be checked is in particular a nuclear spin resonance feature, an electron spin resonance feature or a ferromagnetic resonance feature in a ferro- or ferrimagnetic material.

The sensor element preferably comprises an evaluation unit. The evaluation unit is adapted in particular to generate a check result on the basis of the signal response of the spin resonance feature captured by the resonator. For this purpose, a characteristic property derived from the signal response is preferably compared with a reference value or a reference interval, and if the match is sufficiently high, a positive check result is output, indicating, for example, the authenticity or a class membership of the checked value document. The resonance frequency of the spin resonance, its line width or amplitude, a relaxation time of the spin resonance or the spatial distribution of the spin resonance feature can be used as characteristic properties, for example.

The invention further comprises a checking device for checking the authenticity of flat data carriers, in particular banknotes, with a sensor element of the type described and with a transport device which introduces the flat data carriers to be checked along a transport path into the air gap of the magnetic core or guides them through the air gap of the magnetic core.

In particular, the checking device can be part of a banknote processing machine.

The invention also relates to a use of a sensor element according to the invention. The sensor element is used for checking the authenticity of a flat data carrier with a spin resonance feature. In particular, the checking of the authenticity is carried out using a pulsed measurement method, a continuous-wave (cw) measurement method, a rapid scan measurement method and/or a measurement method with static magnetic field $B_0$.

BRIEF DESCRIPTION OF THE DRAWINGS

Further exemplary embodiments as well as advantages of the invention are explained below with reference to the figures, which have not been reproduced to scale or proportion in order to increase clearness.

It shows.

DETAILED DESCRIPTION OF VARIOUS EMBODIMENTS

Figure 1:
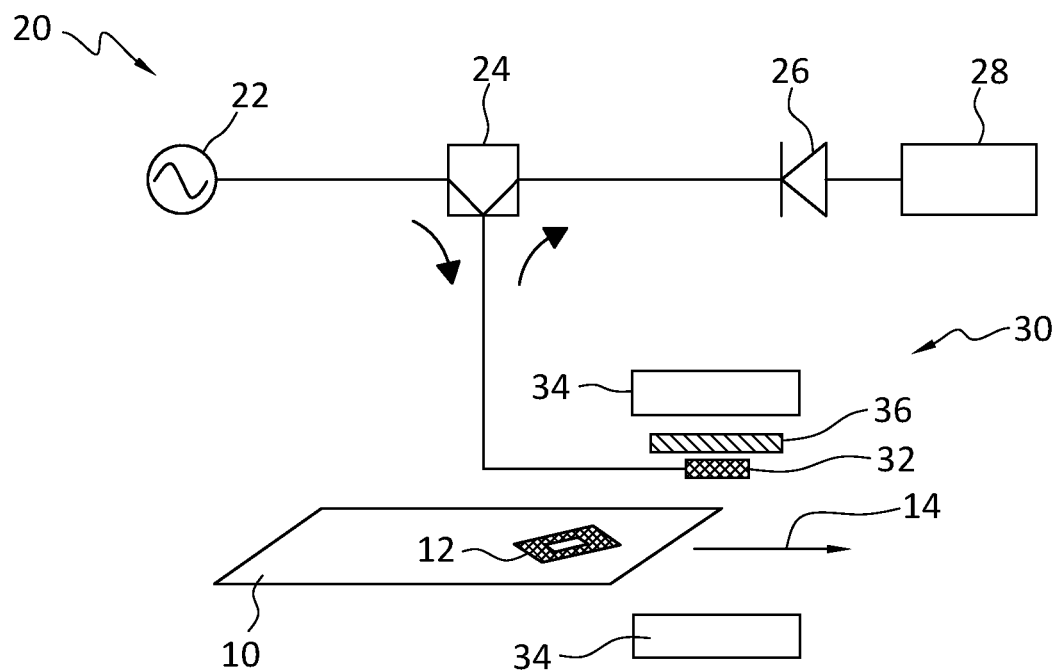
FIG. 1 schematically a checking device with a supplied banknote test specimen.
Figure 2:
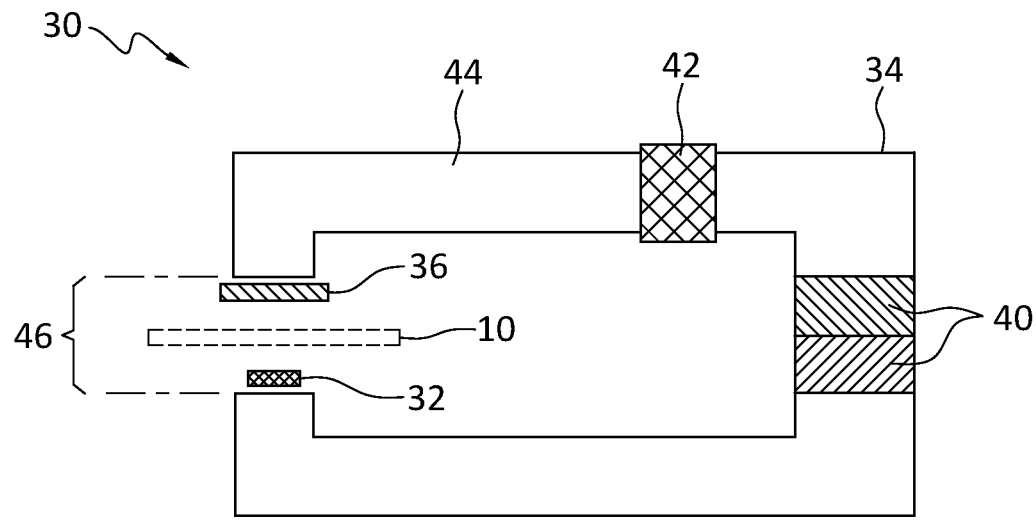
FIG. 2 the sensor element of the checking device of FIG. 1 in more detail in a specific embodiment, FIG. 3 the relative signal intensity as a function of the modulation frequency for two different flux guide pieces in a magnetic core, FIG. 4 a sensor element according to another embodiment of the invention, and FIG. 5 a sensor element according to a further embodiment of the invention.

The invention will now be explained using the example of authenticity checking of a banknote 10. FIG. 1 schematically shows a checking device 20 with a supplied banknote test specimen 10, and FIG. 2 shows the sensor element 30 of the checking device in more detail in a specific embodiment.

With reference first to FIG. 1, a banknote test specimen 10 is guided along a transport path 14 through the checking device 20 in a continuous wave measuring process for authenticity checking. The banknote test specimen 10 comprises, in a feature region, a spin resonance feature 12 to be checked, the characteristic properties of which are used to prove the authenticity of the banknote. Characteristic properties may include, for example, the resonant frequency of the spin resonance, its line width or amplitude, a relaxation time of the spin resonance, or the spatial distribution of the spin resonance feature.

The checking device 20 includes a signal source 22, which in the exemplary embodiment is operated in continuous wave (CW) mode at a fixed excitation frequency ox corresponding to the expected Larmor frequency of the spin resonance feature 12. The excitation signal from the signal source 22 is supplied via a duplexer 24 to a tuned resonator 32 of the sensor element 30, where it generates an alternating magnetic field of frequency $\omega_L$. The resonator 32 is located in the field of a polarization magnet 34 whose field strength is varied in time with a slow ramp ($f_{sweep}$<1 kHz). The response signal of the spin resonance feature 12 is picked up by the resonator 32 and supplied via the duplexer 24 to a detector 26 and an evaluation unit 28.

If the time-varying polarization field in conjunction with the fixed excitation frequency now satisfies the above-mentioned resonance condition $\omega_L = \gamma B_c$, transitions between the spin states are excited in the spin resonance feature 12. This leads to absorption of the alternating magnetic field in the resonator and thus to a reduced resonator quality, which shows up as a level change in the response signal detected by the detector 26.

In order to increase the sensitivity of the checking device 20 and, in particular, to suppress the 1/f noise dominating the signal-to-noise ratio, the sensor element 30 further includes a modulation coil 36 which modulates the polarization field of the magnet 34 and thus also the resonance condition by means of a modulation field B m od parallel to the polarization field. The modulation frequency $f_{mod}$ of the modulation field is usually in the range between about 1 kHz and about 1 MHz and allows a low-noise measurement of the modulated detector signal using lock-in techniques.

In FIG. 2, the sensor element 30 of FIG. 1 is schematically shown in more detail in a specific embodiment. The position of the banknote test specimen 10 is indicated by dashed lines, with the transport path 14 of the banknote test specimen extending perpendicular to the image plane in the figure.

The sensing element 30 includes a polarization magnet 34 with magnetic feedback having a permanent magnet 40, a ramp coil 42, and a magnetic core 44 with an air gap 46. The magnetic core 44 conducts the magnetic flux of the permanent magnet 40 and the ramp coil 42 wound around the magnetic core to the air gap 46 through which the transport path of the banknote test specimen 10 extends.

The sensor element 30 further includes a modulation coil 36, which is arranged close to the air gap, or even in the air gap 46, as in FIG. 2, because of the relatively high modulation frequency $f_{mod}$ compared to the ramp frequency.

In addition to generating the ramp function of the polarization field, the ramp coil 42 also serves to compensate for any drifts in the strength of the polarization field. Because of the comparatively slow time scale, the field changes generated by the ramp coil 42 are well conducted through the magnetic core 44, so that the ramp coil 42 is preferably wound around the magnetic core 44, as shown in FIG. 2, so that the scarce installation space in the air gap 46 is available for other components.

The polarization field present in the air gap 46 has a static and a time-varying portion, wherein the static portion in the exemplary embodiment is generated by the permanent magnet and the time-varying portion is generated by the ramp coil 42 and the modulation coil 36. The ramp coil 42 generates the slow field changes (ramp function and drift compensation with $f_{sweep}$<1 kHz), the modulation coil 36 generates the fast field changes with $f_{mod}$=1 kHz . . . 1 MHz. In the exemplary embodiment, the static portion of the polarization field is generated by means of a permanent magnet 40, which reduces the energy consumption and the waste heat compared to a setup in which also the static portion is generated by an electromagnet.

In principle, the modulation coil 36 and the ramp coil 42 can each be present along the magnetic circuit in the air gap 46, wound around the magnetic core 44 or wound around the permanent magnet 40. The modulation coil and ramp coil may also be formed by a single, common coil. In the advantageous configuration of FIG. 2, separate coils are provided for the modulation and the ramp function, with the modulation coil 36 being arranged in the air gap 46 and the ramp coil 42 being wound around the magnetic core 44. This provides better electrical separation between the signal sources for the modulation signal and for the ramp signal, allowing for a simpler design of the electronics.

As a special feature, the magnetic core 44 of the sensor element 30 is formed at least in part of an eddy current damping magnetic material, i.e., of a material that nevertheless comprises low electrical conductivity while maintaining high permeability and high saturation flux density.

Due to this design, the magnetic core 44 fulfills several requirements at the same time. On the one hand, it comprises a high permeability 11, and can therefore bundle the magnetic flux of the permanent magnet 40 and the coils 42 wound around the core or the permanent magnet well and conduct it to the air gap 46 largely without loss. Also, undesirable magnetic leakage flux outside the air gap and across the yokes of the magnetic core is strongly suppressed. The magnetic core 44 further comprises a high saturation flux density $B_S$ and can thus generate a high magnetic field in the air gap 46, and also enables a compact design of the sensor element 30.

In addition, the magnetic core 44 comprises low electrical conductivity, and thus eddy current damping properties, at least in critical part regions thereof. The inventors have recognized that several advantages can thereby be realized over magnetic cores made of solid material.

For magnetic cores made of a solid material with high permeability µ and high saturation flux density $B_S$, such as soft iron, eddy currents are induced in the magnetic core by the time-varying magnetic fields due to the high conductivity of the soft iron. The strength of these eddy currents thereby increases with the conductivity of the solid material and with the modulation frequency. These eddy currents have several adverse and undesirable consequences:

Firstly, according to Lenz's law, the magnetic field generated by eddy currents has a polarity opposite to its cause, so the eddy currents attenuate the modulation field, the ramp field or even a pulsed high-frequency field. Since the use signal of a spin resonance measurement is directly proportional to the strength of the modulation field, the eddy currents lead to a loss of signal.

Furthermore, sensor operation requires short measurement times and therefore high modulation frequencies, especially on fast-running banknote processing machines. Since the strength of the eddy currents increases with the modulation frequency, a sensor operation on fast machines is made difficult or impossible.

The energy dissipation in the magnetic core associated with the eddy currents also leads to a temperature increase of the core and thus to a changing magnetic resistance, which in turn leads to a drift of the flux density in the air gap and thus ultimately to an undesired drift of the use signal. Finally, the inventors have also found that eddy currents in pulsed high-frequency excitation lead to artifacts in the measurement signal, and that they create magnetic inhomogeneities, leading to a broadening of the spectral lines of the high-frequency resonance.

All these disadvantages can be greatly reduced or completely avoided by the configuration of the magnetic core according to the invention. This allows the use of high modulation frequencies and thus makes measurements on fast-moving banknotes possible. Strong modulation fields also lead to a better signal-to-noise ratio and thus to more accurate measurement results. The reduced energy dissipation in the magnetic circuit also stabilizes the polarization field, thereby allowing more reproducible measurements. Finally, an eddy current damping magnetic core also allows a greater freedom of the arrangement of the components. For example, the modulation coil can then be wound around the eddy current damping magnetic core because of the lower losses, thereby freeing up scarce installation space at or in the air gap. For magnetic cores of solid material, on the other hand, a direct coupling of the high-frequency modulation field into the magnetic core is not practical because of the large, induced eddy currents.

Sheet/lamellae packages made of soft magnetic materials, ferrites and powder materials made of soft magnetic materials have proven to be well-suited eddy current damping magnetic materials, as already explained in more detail above.

Figure 3:
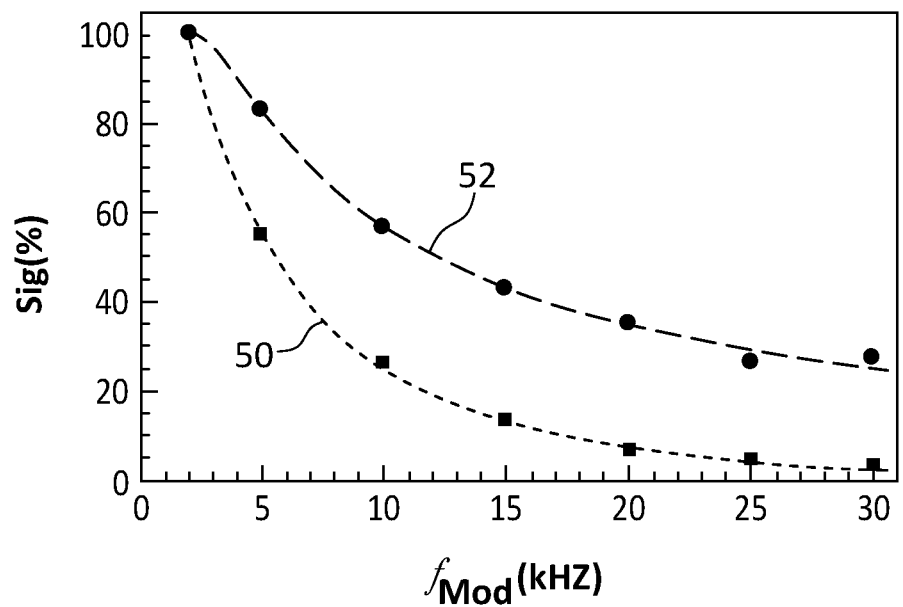

FIG. 3 illustrates the advantageous properties of a magnetic core with eddy current damping elements in a sensor element 30. The starting point is a sensor element with a magnetic core made of soft iron with an NdFeB permanent magnet, a ramp coil away from the air gap and a modulation coil near the air gap. The air gap in the soft iron core has a height of 10 mm and a square cross-section with an edge length of 30 mm.

In order to create an air gap with a height of only 5 mm, a flux guide piece with dimensions of 30×30×5 mm³ is respectively inserted into the air gap of the soft iron core. In a first variant, the flux guide piece consists of a NiZn-based ferrite and in a second variant of a SiFe-based powder material. By inserting these flux guide pieces, a magnetic core is created which consists of an eddy current damping material near the gap where the alternating magnetic field and thus the induced eddy currents are strongest.

In a reference example, a flux guide piece of soft iron was used so that the reference core does not have a region with eddy current damping material.

In the 5 mm high air gap of the magnetic cores created in each case, the response signal of a sample loaded with a spin resonance feature was then investigated in the center of the air gap as a function of the modulation frequency, wherein modulation frequencies $f_{mod}$ between 2 and 30 kHz were used. The integral of the resonance curve represents the RF absorption as a function of magnetic field strength. In each case, the area under the absorption curve was determined as a measure of the signal intensity, and the signal intensities were normalized to 100% for comparison at the modulation frequency $f_0$=2 kHz.

The results obtained are shown in FIG. 3, where the relative signal intensity in percent based on the signal strength at $f_0$=2 kHz is shown as a function of the modulation frequency. As can be seen from the figure, for the reference example (soft iron, curve 50), the use signal decreases significantly faster with the modulation frequency than when using flux guide pieces made of ferrites (curve 52).

Without being committed to a particular explanation, this more rapid signal decrease is attributed to losses due to eddy currents induced by the field modulation in the soft iron flux guide piece. These eddy currents weaken the modulation field and thus also the spin resonance signal curve.

In the case of the ferrite flux guide piece, the signal decrease is much smaller due to the strongly reduced eddy currents. For quantification, the $f_{50\%}$ modulation frequency was determined, i.e., the frequency at which the signal strength decreased to 50% of the reference value. As shown in FIG. 3, an increase of 120% in the $f_{50\%}$ modulation frequency can be achieved by using a ferrite flux guide piece compared to a soft iron flux guide piece. When using a powder flux guide piece with a SiFe-based powder material, an increase of 50% in the $f_{50\%}$ modulation frequency was obtained in an analog measurement compared to the soft iron flux guide piece.

Figure 4:
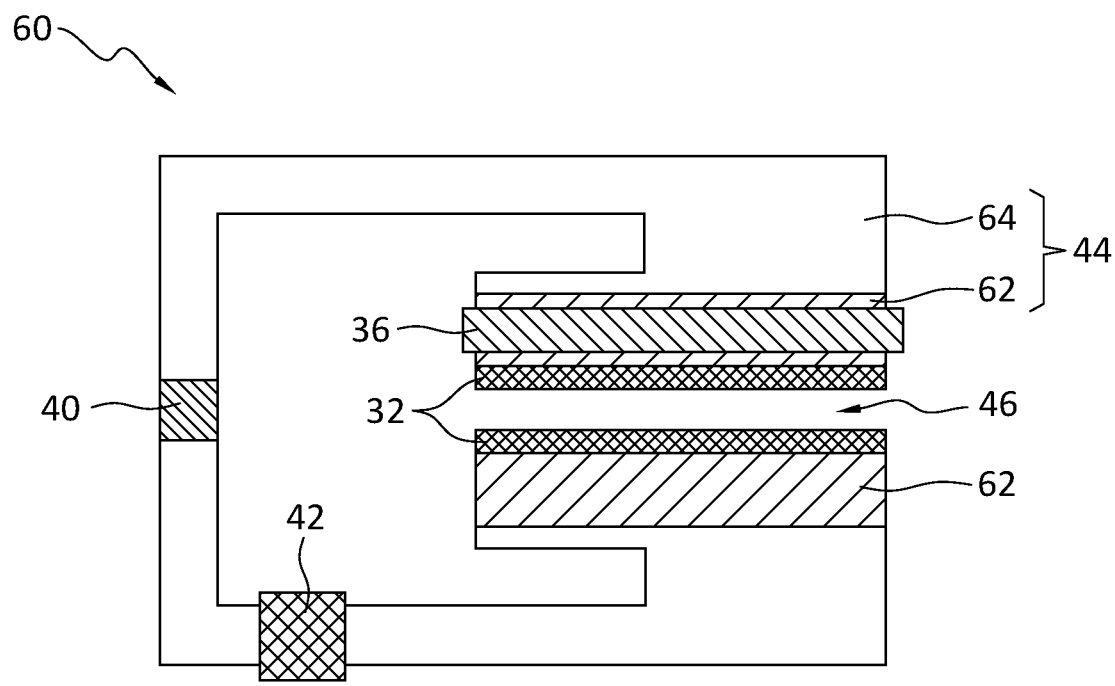

FIG. 4 shows, as a further exemplary embodiment of the invention, a sensor element 60 that can be easily integrated into a banknote processing machine. The banknotes to be checked are transported perpendicular to the image plane through the air gap 46 of the magnetic core.

The magnetic core 44 of the sensor element 60 is characterized by the use of a single permanent magnet 40 arranged on the side opposite to the air gap 46 in the magnetic circuit of the magnetic core 44. Furthermore, both eddy current damping ferrite elements 62 and eddy current damping electrical sheet elements 64 are used as magnetic conductors in the magnetic core 44.

The two eddy current damping ferrite elements 62 are located near the air gap 46, with the modulation coil 36 wound around one of the ferrite elements 62. The electrical sheet elements 64, which also attenuate eddy currents, form the remainder of the magnetic core 44. The ramp coil 42 is wound around the magnetic core 44 away from the air gap 46. Since the magnetic core 44 in the exemplary embodiment is formed solely by eddy current damping elements 62, 64, the ramp coil 42 also allows a rapid ramping of the field in the air gap 46, in addition to a field compensation.

The resonator 32 used is a surface resonator that can be easily integrated into the air gap 46 and is optimized for measuring the spin resonance features of banknotes.

Figure 5:
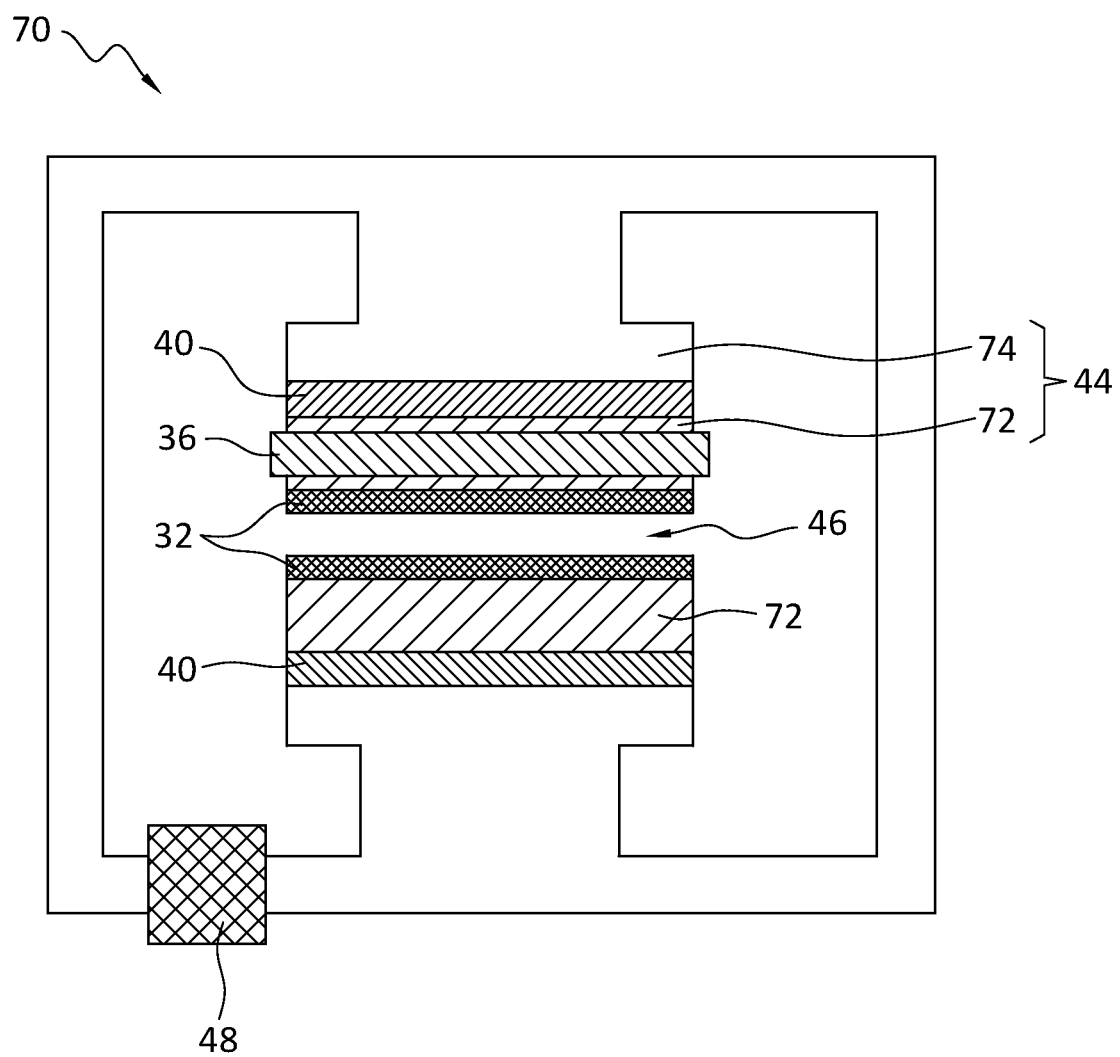

A sensor element 70 for a banknote checking device according to a further exemplary embodiment of the invention is illustrated in FIG. 5. Due to its design, the sensor element 70 can also be integrated in a simple manner into a banknote processing machine, wherein the banknotes to be checked are transported perpendicular to the image plane through the air gap 46 of the magnetic core.

The magnetic core 44 of the sensor element 70 includes two permanent magnets 40 which are used near the air gap 46. The magnetic core 44 includes eddy current damping powder core elements 72 in the region between each of the permanent magnets 40 and the air gap 46, and the remainder of the magnetic core is formed by soft iron solid material 74. The modulation coil 36 is wound around one of the two powder core elements 72, while a compensation coil 48 away from the air gap 46 is wound around a soft iron region 74 of the magnetic core. Thus, in this exemplary embodiment, the compensation coil 48 is used only for slow drift compensation. As in the exemplary embodiment of FIG. 4, a surface resonator that can be easily integrated is used as the resonator 32.

Also, in the configuration of FIG. 5, the eddy currents generated by the modulation coil 36 are effectively suppressed by the eddy current damping powder core elements 72 as compared to a similar design with a magnetic core consisting entirely of soft iron solid material.

The invention claimed is:

1. A sensor element for checking a flat data carrier, with a spin resonance feature, with
   a magnetic core with an air gap into which the flat data carrier is insertable for authenticity checking,
   an element for generating a static magnetic flux in the air gap,
   a modulation coil for generating a time-varying magnetic field in the air gap, and
   a resonator for exciting the spin resonance feature of the data carrier to be checked and for capturing the signal response of the spin resonance feature,
   an evaluation unit which is adapted to generate a check result on the basis of the captured signal response of the spin resonance feature,
   wherein the magnetic core is formed at least in part of an eddy current damping magnetic material, and
   wherein the element for generating a static magnetic flux comprises at least one permanent magnet.

2. The sensor element according to claim 1, wherein the magnetic core comprises, as eddy current damping magnetic material, a lamellae package of a soft magnetic material, based on an SiFe alloy, an NiFe alloy, a CoFe alloy, an AlFe alloy or a metallic glass.

3. The sensor element according to claim 1, wherein the magnetic core comprises, as eddy current damping magnetic material, a ferrite, in particular based on MnZn or NiZn.

4. The sensor element according to claim 1, wherein the magnetic core comprises, as eddy current damping magnetic material, a powder of soft magnetic bodies electrically insulated from each other.

5. The sensor element according to claim 1, wherein the magnetic core comprises, in addition to the at least one eddy current damping magnetic material, a solid material of high permeability and high saturation flux density.

6. The sensor element according to claim 1, wherein the magnetic core is formed by an eddy current damping magnetic material at least in one region adjacent to the air gap.

7. The sensor element according to claim 1, wherein the modulation coil is arranged in the air gap of the magnetic core.

8. The sensor element according to claim 1, wherein the modulation coil is wound around a region of the magnetic core with eddy current damping magnetic material around a region with said ferrite magnetic material or powder magnetic material.

9. The sensor element according to claim 1, wherein the resonator is arranged in the air gap of the magnetic core.

10. The sensor element according to claim 1, wherein the sensor element has a ramp coil for generating a magnetic field in the air gap which varies slowly in time with respect to the modulation field, which ramp coil is wound around the magnetic core.

11. The sensor element according to claim 10, wherein the modulation coil is adapted to generate a magnetic field in the air gap varying with a frequency between about 1 kHz and about 1 MHz, and/or in that the ramp coil is adapted to generate a magnetic field in the air gap varying with a frequency below about 1 kHz, and/or in that the resonator is adapted to ex-cite and capture spin resonance signals with a frequency between about 1 MHz and 100 GHz.

12. A checking device for checking the authenticity of flat data with a sensor element according to claim 1 and with a transport device which introduces the flat data carriers to be checked along a transport path into the air gap of the magnetic core or guides them through the air gap of the magnetic core.

13. Use of a sensor element according to claim 1 for checking the authenticity of a flat data carrier with spin resonance feature.

* * * * *